(12) United States Patent
Yokoi

(10) Patent No.: US 11,490,525 B2
(45) Date of Patent: Nov. 1, 2022

(54) SUPPLY UNIT, PRINTING DEVICE, AND METHOD FOR CONTROLLING PRINTING DEVICE

(71) Applicant: FUJI CORPORATION, Chiryu (JP)

(72) Inventor: Yoshimune Yokoi, Kiyosu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/601,540

(22) PCT Filed: Apr. 26, 2019

(86) PCT No.: PCT/JP2019/017982
§ 371 (c)(1),
(2) Date: Oct. 5, 2021

(87) PCT Pub. No.: WO2020/217468
PCT Pub. Date: Oct. 29, 2020

(65) Prior Publication Data
US 2022/0183160 A1  Jun. 9, 2022

(51) Int. Cl.
*H05K 3/12* (2006.01)
*H05K 3/34* (2006.01)

(52) U.S. Cl.
CPC ......... *H05K 3/1225* (2013.01); *H05K 3/1233* (2013.01); *H05K 3/34* (2013.01)

(58) Field of Classification Search
CPC ....... H05K 3/1225; H05K 3/1233; H05K 3/34
See application file for complete search history.

(56) References Cited

U.S. PATENT DOCUMENTS

2015/0367370 A1  12/2015  Dodd et al.
2016/0303864 A1  10/2016  Ando et al.

FOREIGN PATENT DOCUMENTS

| EP | 3482940 A1 * | 5/2019 | .......... B41F 15/0813 |
|---|---|---|---|
| JP | 2008-137159 A | 6/2008 | |
| JP | H0642166 U * | 11/2014 | |
| JP | 2016-205171 A | 12/2016 | |
| JP | 2018-118407 A | 8/2018 | |
| JP | 2018118407 A * | 8/2018 | |

OTHER PUBLICATIONS

International Search Report dated Jun. 4, 2019 in PCT/JP2019/017982 filed on Apr. 26, 2019, 2 pages.

* cited by examiner

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

The supply unit is used in a printing device to perform a print process of a viscous fluid on a printing target to supply the viscous fluid. The supply unit includes an attachment section to and from which a cartridge accommodating the viscous fluid is attachable or detachable, a restricting wall section configured to cover the cartridge and restrict access to an inside of the printing device, and a driving section configured to move the cartridge attached to the attachment section and the restricting wall section in a supply operation direction.

7 Claims, 10 Drawing Sheets

SUPPLY UNIT, PRINTING DEVICE, AND METHOD FOR CONTROLLING PRINTING DEVICE

TECHNICAL FIELD

The present specification discloses a supply unit, a printing device, and a control method for a printing device.

BACKGROUND ART

Conventionally, in a printing device for performing a print process of a viscous fluid such as solder on a printing target such as a substrate using a screen mask, a device including a solder supply device for supplying the solder has been proposed (refer to Patent Literature 1, for example). In this printing device, a standby space portion where a container exchange section of the solder supply device on which a solder container is installed in a replaceable manner can enter includes a body cover that is partially formed with an opening/closing door, and thus, the solder container can be replaced without stopping driving of the device while securing security.

PATENT LITERATURE

Patent Literature 1: JP-A-2018-118407

BRIEF SUMMARY

Technical Problem

However, in the above-described printing device, a structure such as a wall surface and a bottom surface for restricting an operator's access to the inside of the device is provided on a body cover on a main body side, it is necessary to specially provide a standby space portion on the main body side, and thus, there is a problem that the configuration of the body cover or the like is complicated.

The present disclosure has been made in view of such problems, and a main object of the present disclosure is to provide a supply unit, a printing device, and a control method for a printing device capable of securing security and suppressing interruption of processing while further simplifying a configuration when exchanging a cartridge of a viscous fluid.

Solution to Problem

A supply unit, a printing device, and a control method for a printing device disclosed in the present specification adopt the following means in order to achieve the main object described above.

According to an aspect of the present disclosure, there is provided a supply unit used in a printing device for performing a print process of a viscous fluid on a printing target to supply the viscous fluid, the supply unit including: an attachment section to and from which a cartridge accommodating the viscous fluid is attachable or detachable; a restricting wall section configured to cover the cartridge and restrict access to an inside of the printing device; and a driving section configured to move the cartridge attached to the attachment section and the restricting wall section in a supply operation direction.

In this supply unit, both the attachment section to and from which the cartridge accommodating the viscous fluid is attachable or detachable and the restricting wall section configured to cover the cartridge and restrict the access to the inside of the printing device are moved in the supply operation direction. Generally, in a case where the restricting wall section for restricting the access to the inside of the printing device is disposed on a main body side of the printing device, the cartridge may move in various directions with respect to the main body of the printing device, and thus, it is necessary to provide a space for accommodating the cartridge or the like in the restricting wall section, the configuration is complicated. In the supply unit of the present disclosure, since the restricting wall section moves together with the cartridge, the restricting wall section always exists in the vicinity of the cartridge even when the cartridge is exchanged, and a special space for accommodating the cartridge is not required. Accordingly, in this supply unit, when exchanging the cartridge of the viscous fluid, security can be secured and interruption of the process can be further suppressed while simplifying the configuration. Here, the expression "access to the inside of the printing device" means that an operator inserts his/her hands into the inside of a device having an operating configuration. Moreover, examples of the "printing target" include a substrate, a three-dimensional object, or the like on which components are to be mounted. In addition, examples of the "viscous fluid" include solder paste, conductive paste, and adhesive. Moreover, the expression "suppressing the interruption of the process" means suppressing the interruption of the process related to printing, and includes, for example, the conveyance-in and conveyance-out process of the printing target, a positioning processing between the screen mask and the printing target, a cleaning process of the screen mask M, or the like in addition to the print process itself.

DESCRIPTION OF EMBODIMENTS

Figure 1:
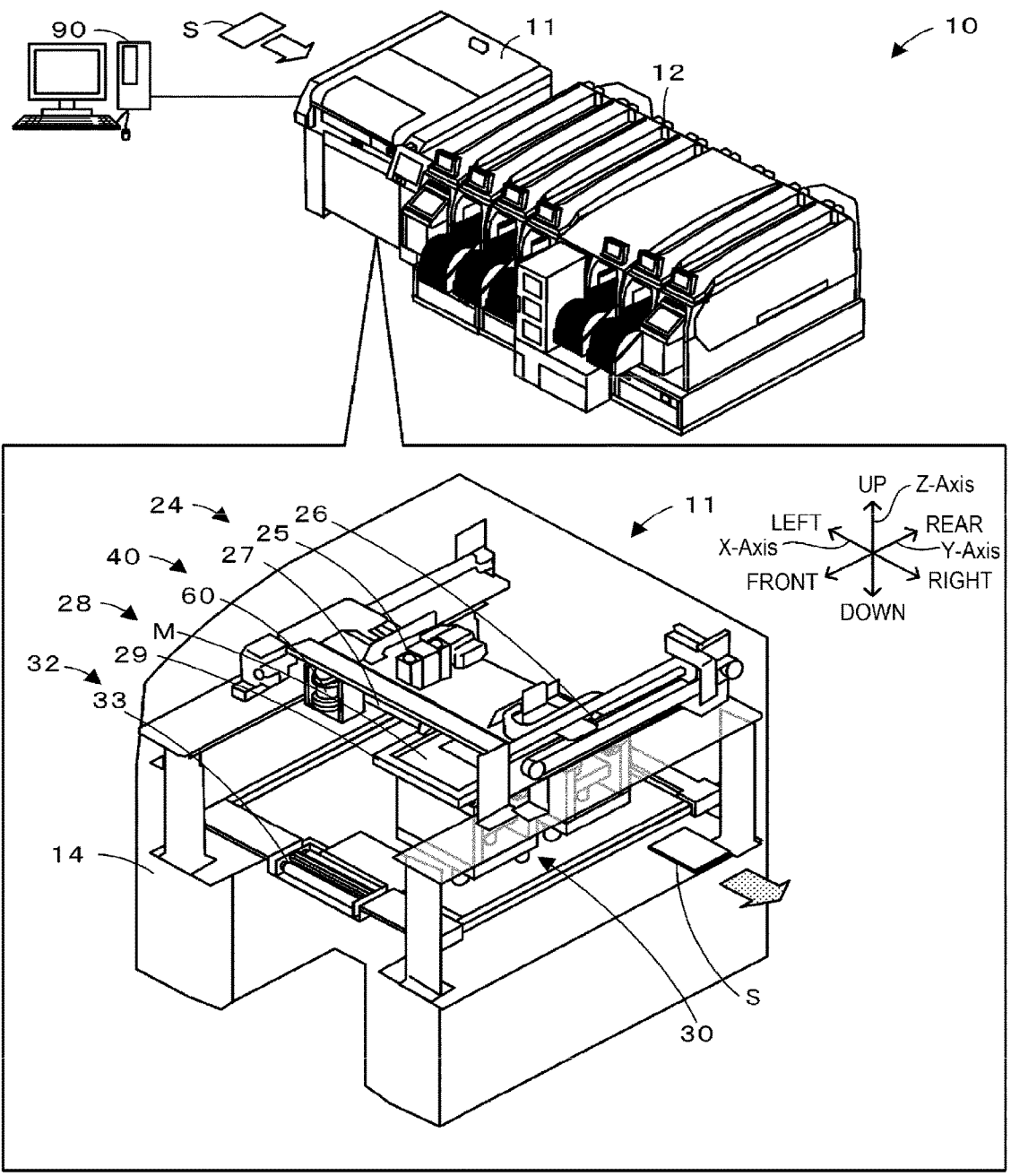
FIG. 1 is a schematic explanatory view illustrating an example of mounting system 10.
Figure 2:
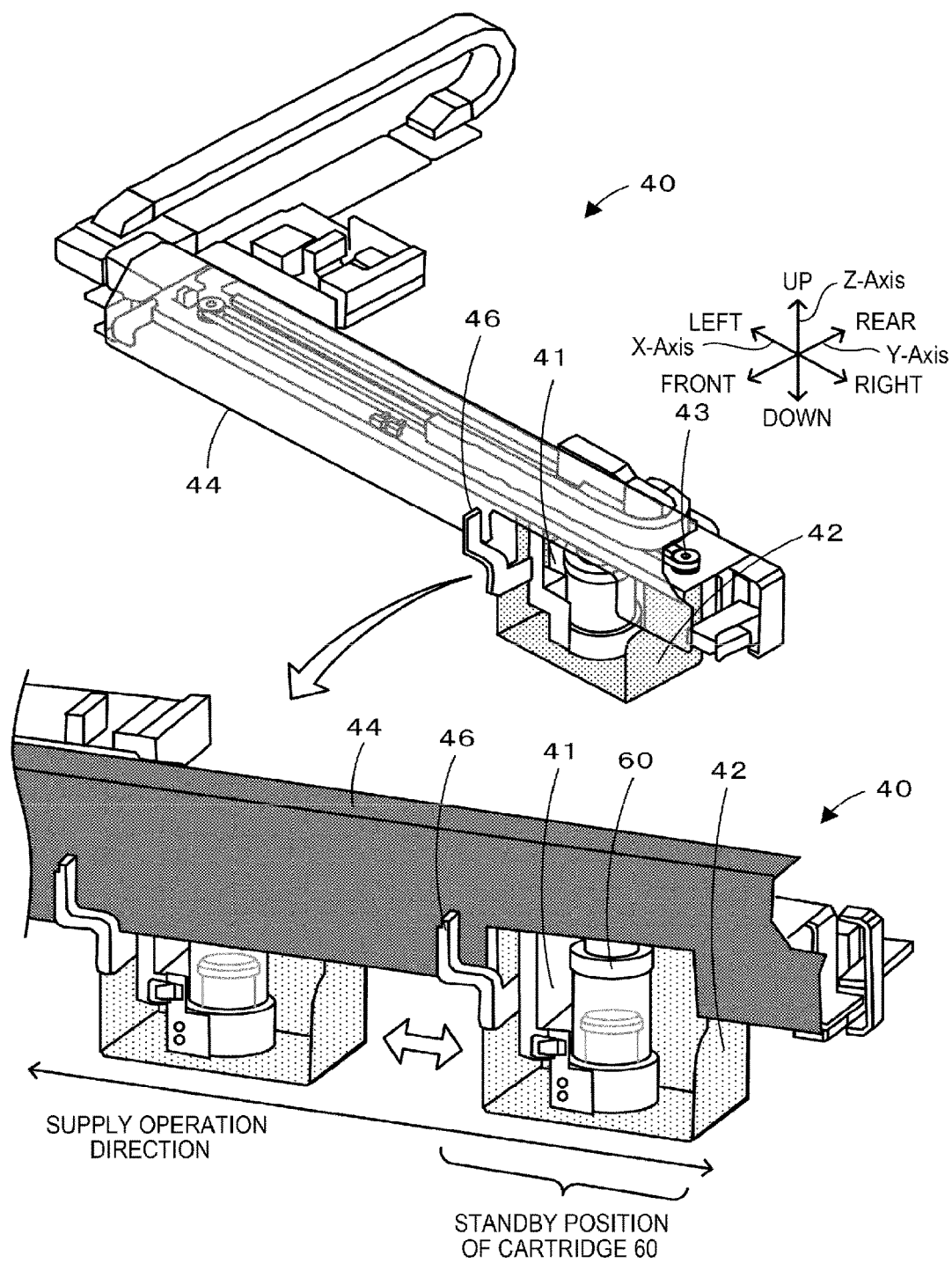
FIG. 2 is an explanatory view of supply unit 40.
Figure 3:
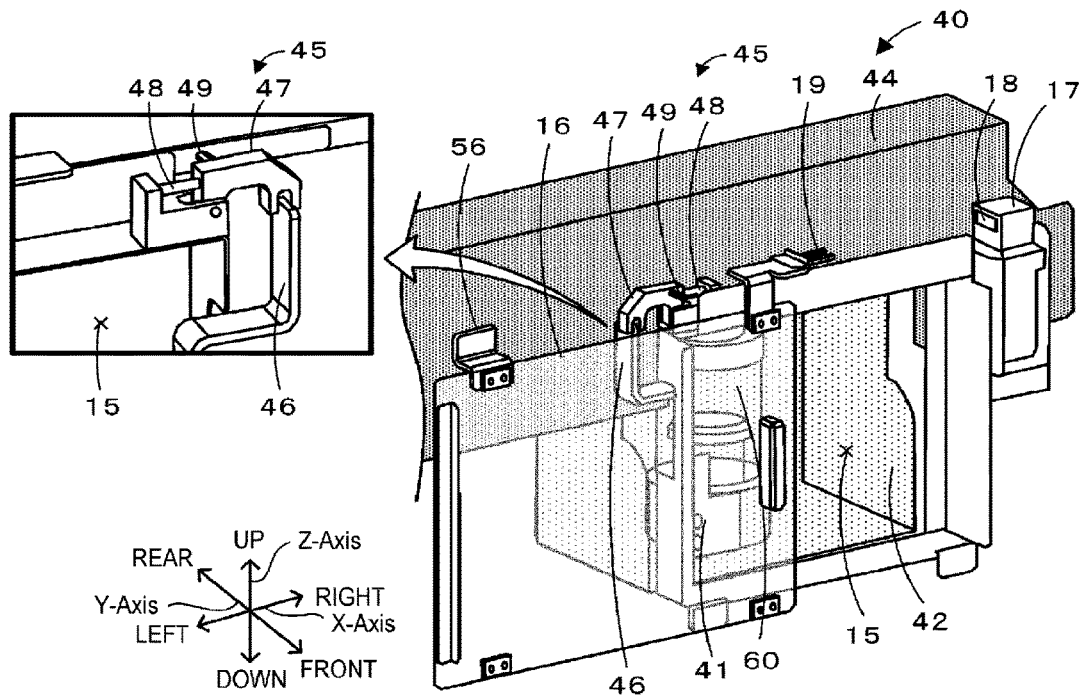
FIG. 3 is an explanatory view of closing mechanism 17 and fixing mechanism 45 when door member 16 is opened.

The present embodiment will be described below with reference to the drawings. FIG. 1 is a schematic explanatory view illustrating an example of mounting system 10 including printing device 11 which is an example of the present disclosure. FIG. 2 is an explanatory view of supply unit 40. FIG. 3 is an explanatory view of closing mechanism 17 and fixing mechanism 45 when door member 16 is opened. FIG.

Figure 5:
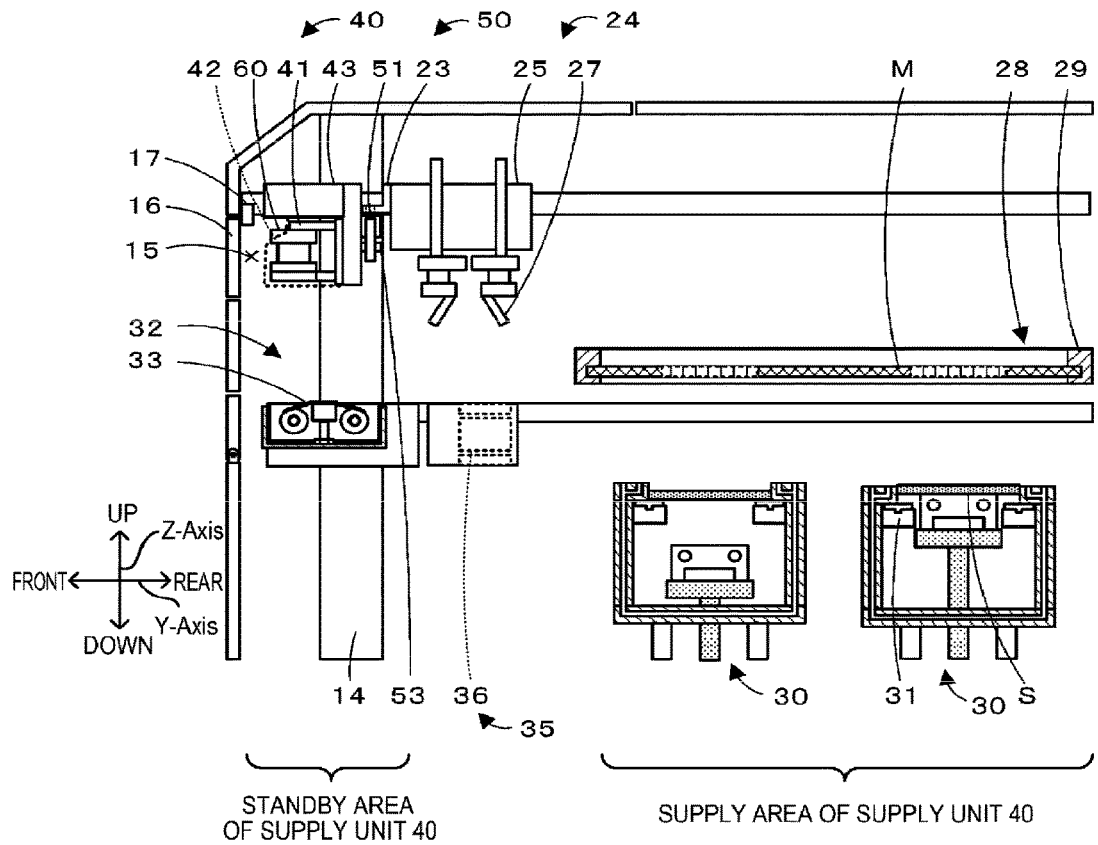
FIG. 5 is an explanatory view of printing section 24, mask section 28, imaging section 35, and supply unit 40.
Figure 6:
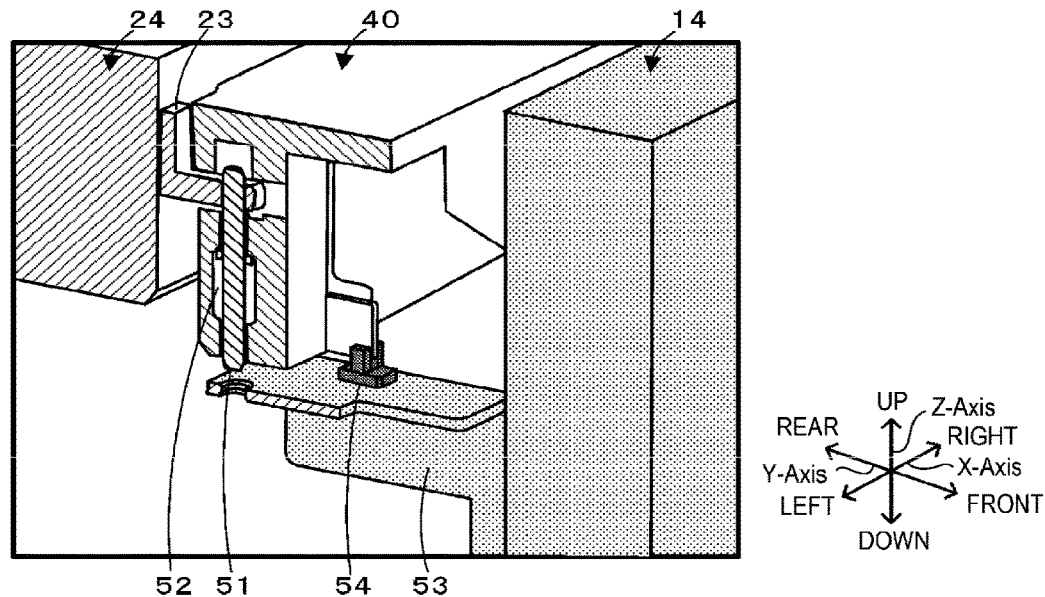
FIG. 6 is an explanatory view of coupling section 50 in a coupling state.
Figure 7:
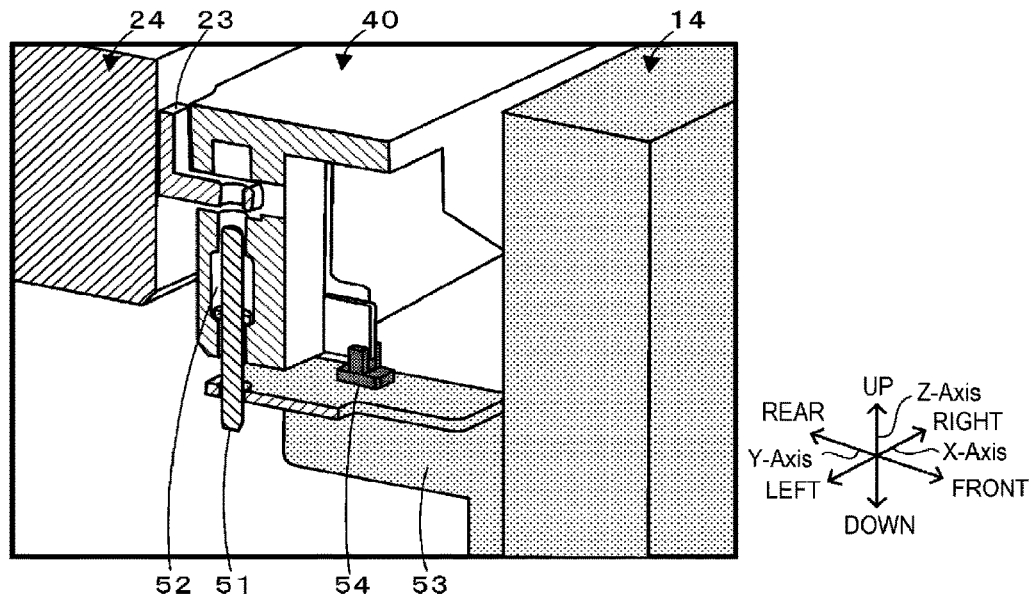
FIG. 7 is an explanatory view of coupling section 50 in a fixed state.
Figure 8:
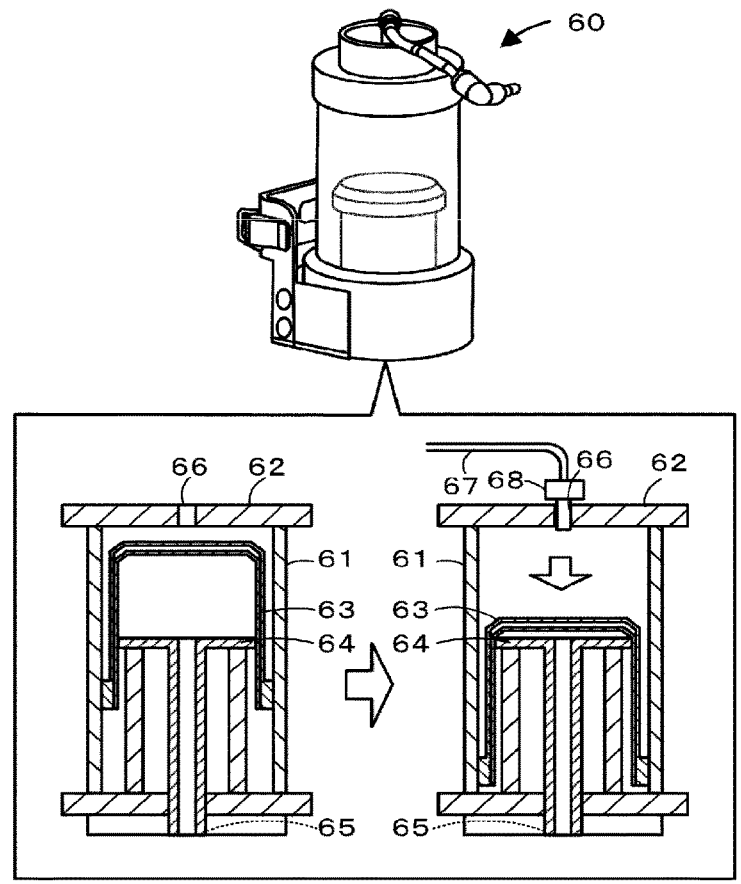
FIG. 8 is an explanatory view of cartridge 60.
Figure 9:
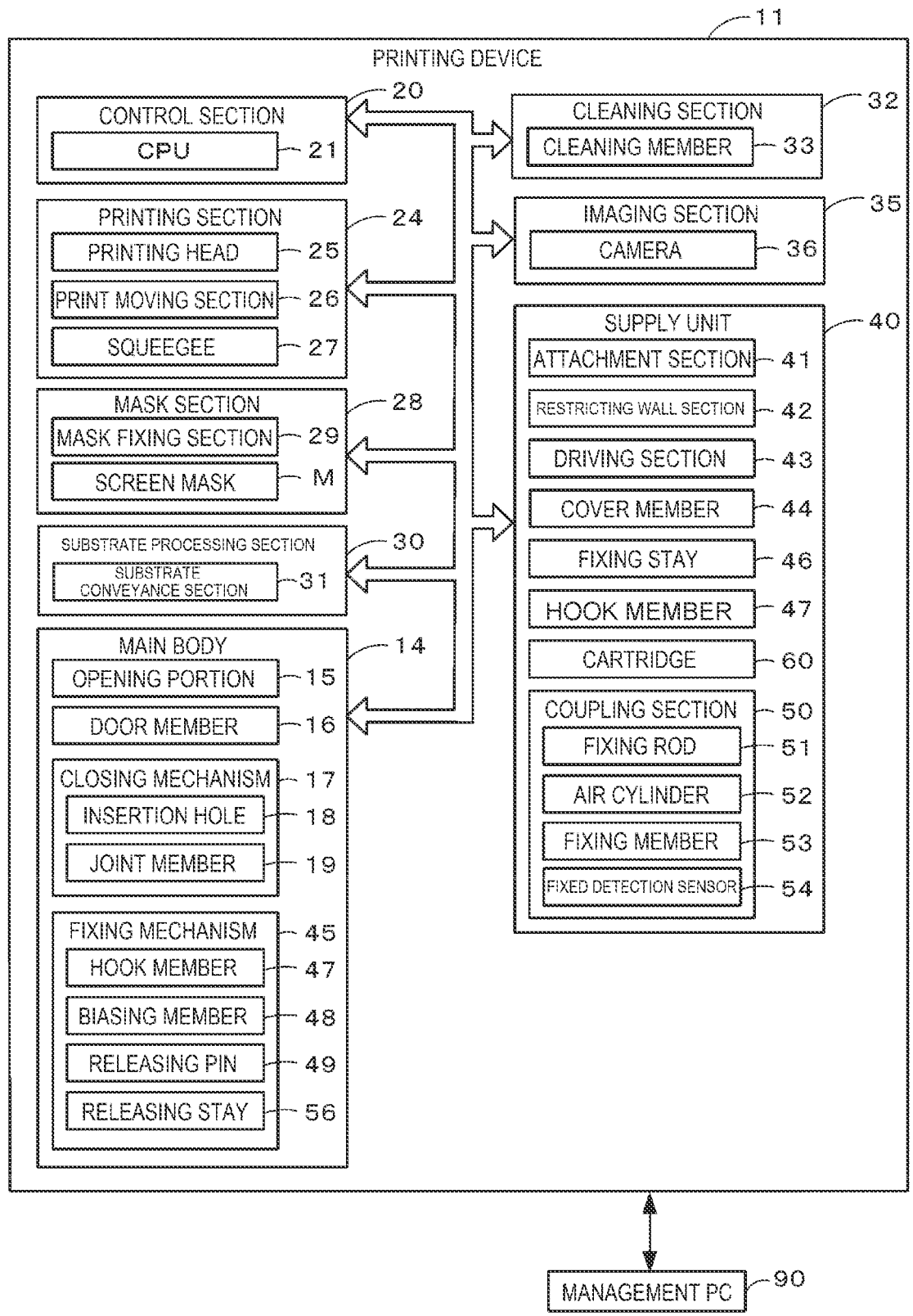
FIG. 9 is a block diagram illustrating an electrical connection relationship of printing device 11.

4 is an explanatory view of closing mechanism 17 and fixing mechanism 45 when door member 16 is closed. FIG. 5 is an explanatory view of printing section 24, mask section 28, imaging section 35, and supply unit 40. FIG. 6 is an explanatory view of coupling section 50 in a coupling state in which fixing rod 51 is at a moving section coupling position. FIG. 7 is an explanatory view of coupling section 50 in a fixed state in which fixing rod 51 is at a main body fixing position. FIG. 8 is an explanatory view of cartridge 60. FIG. 9 is a block diagram illustrating an electrical connection relationship of printing device 11. Mounting system 10 is, for example, a system for mounting a component on substrate S. Mounting system 10 includes printing device 11, mounting device 12, and management computer (PC) 90. Mounting system 10 is configured as a mounting line in which multiple mounting devices 12 that mount components on substrate S are disposed on a downstream side of printing device 11. In the present embodiment, a left-right direction (X-axis), a front-rear direction (Y-axis), and an up-down direction (Z-axis) are as illustrated in FIGS. 1 to 7, 11, and 12.

Mounting device 12 is a device that mounts a component on substrate S, on which a viscous fluid such as solder paste is printed by printing device 11. Management PC 90 is a device for managing information of each device of mounting system 10. Management PC 90 manages a progress state of each device on the mounting line. Each device of mounting system 10 exchanges information with management PC 90 to obtain information such as progress states of other devices.

Printing device 11 is a device configured to apply (print) a solder paste as a viscous fluid to substrate S which is a printing target below via a pattern hole formed in screen mask M by pushing the solder paste on screen mask M into a pattern hole formed in screen mask M using squeegee 27. Examples of the "printing target" include substrate S, a three-dimensional object, or the like on which a component is mounted. Examples of the "viscous fluid" include solder paste, conductive paste, and adhesive. Here, substrate S and the solder paste will be described below as examples. Printing device 11 includes control section 20 (refer to FIG. 9), printing section 24, mask section 28, substrate processing section 30, cleaning section 32, imaging section 35, and supply unit 40 serving as a supply section. Control section 20 is configured as a microprocessor mainly including CPU 21, and controls entire printing device 11. Although described in detail later, control section 20 unlocks door member 16 in a state where print moving section 26 and supply unit 40 are disconnected and when cartridge 60 of supply unit 40 is at a standby position. In addition, control section 20 executes a supply process of the viscous fluid after door member 16 is closed by closing mechanism 17 in a state where print moving section 26 and supply unit 40 are connected to each other.

Figure 4:
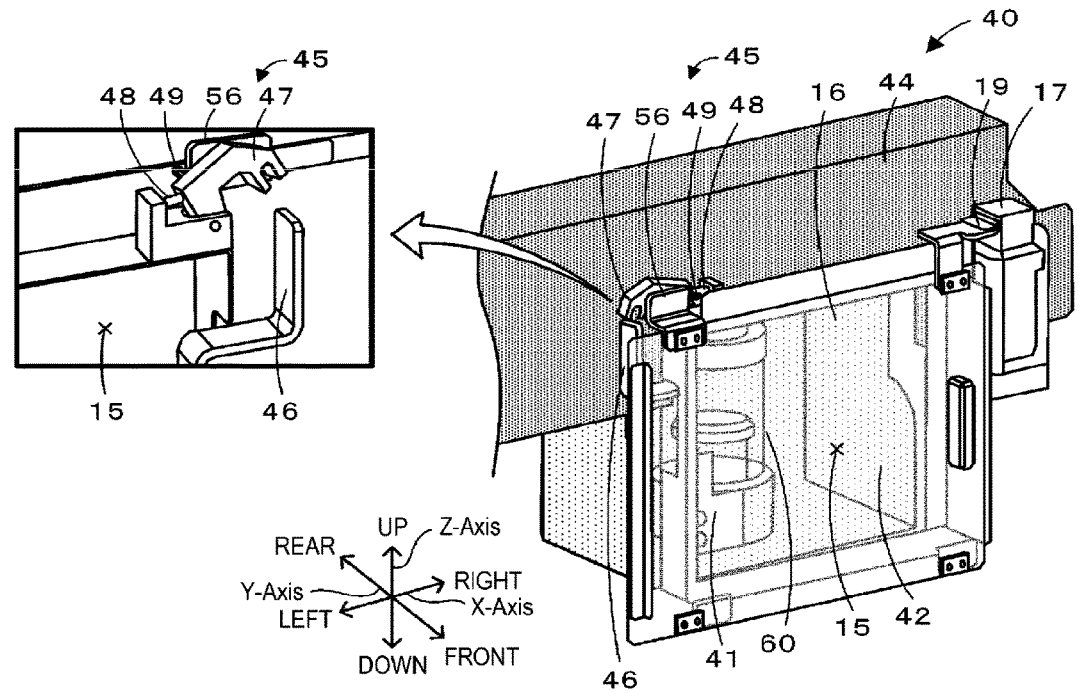
FIG. 4 is an explanatory view of closing mechanism 17 and fixing mechanism 45 when door member 16 is closed.

As illustrated in FIGS. 3 and 4, door member 16 that opens and closes opening portion 15 and is lockable in a closed state is disposed in main body 14 of printing device 11. Opening portion 15 is an area through which cartridge 60 passes when cartridge 60 moves to the outside or the inside by replacement or the like when supply unit 40 is in a standby area (refer to FIG. 5) and cartridge 60 is at the standby position (refer to FIG. 2). Door member 16 is a cartridge exchange dedicated door member opened only when cartridge 60 is exchanged. Door member 16 is disposed on a front right side of main body 14 of the printing device so as to open or close opening portion 15 provided on an extension line in a movement direction (front-rear direction) of supply unit 40. An open position of door member 16 is a standby position (initial position) of cartridge 60. Door member 16 is configured as a sliding window that slides in the left-right direction. As illustrated in FIGS. 3 and 4, closing mechanism 17 is disposed in printing device 11. Closing mechanism 17 is a mechanism for causing door member 16 to be in a closed state by inserting joint member 19 fixed to door member 16 into insertion hole 18 formed in a housing of closing mechanism 17. A hole portion is provided at a distal end of joint member 19, and a lock pin provided in an inside of closing mechanism 17 is inserted into the hole portion to lock door member 16. Closing mechanism 17 includes a solenoid for driving the lock pin. In addition, a closure sensor (not illustrated) is disposed in closing mechanism 17, and thus, the insertion and locking states of joint member 19 can be detected. Control section 20 can detect that door member 16 is closed by an output signal of the closure sensor.

Printing section 24 is disposed in an upper stage of printing device 11, and is a unit configured to perform printing process of the viscous fluid on substrate S using screen mask M. Printing section 24 includes printing head 25, print moving section 26, a squeegee lifting and lowering section, and squeegee 27. Print moving section 26 moves printing head 25 in a predetermined printing direction (here, the front-rear direction), and includes a slider that moves along a guide formed in the front-rear direction and a motor that drives the slider. Squeegee 27 is disposed on a lower surface side of printing head 25 and is lifted or lowered by a squeegee raising/lowering section. Printing section 24 has two squeegees 27 used in the front-rear direction. Printing section 24 can be connected to and disconnected from supply unit 40, and print moving section 26 moves supply unit 40 together with printing head 25. Although supply unit 40 does not have a moving section such as a motor, supply unit 40 is coupled to printing section 24 by coupling section 50, and moves in the front-rear direction between the supply area and the standby area by print moving section 26 (refer to FIG. 5). Engagement member 23 is a member coupled to supply unit 40 by coupling section 50 provided in supply unit 40 (refer to FIGS. 5 to 7). Engagement member 23 includes an insertion hole into which fixing rod 51 is inserted.

Mask section 28 is disposed between printing section 24 and substrate processing section 30 in the up-down direction, and is a unit that fixedly holds screen mask M. Mask section 28 includes mask fixing section 29. Mask fixing section 29 positions screen mask M and supports and fixes screen mask M in a horizontal posture. Substrate processing section 30 is a unit that is disposed below mask section 28, conveys in substrate S, positions and supports carried-in substrate S, and brings substrate S into contact with screen mask M or separates substrate S from screen mask M. Substrate processing section 30 includes substrate conveyance section 31 that conveys substrate S in the left-right direction, a substrate supporting member that supports substrate S from below, and support raising/lowering section that lifts or lowers entire substrate processing section 30 and the substrate supporting member. Cleaning section 32 is disposed between mask section 28 and substrate processing section 30 in the up-down direction, and is a unit that performs a cleaning process for cleaning a rear surface of screen mask M by cleaning member 33. Examples of cleaning member 33 include cleaning paper. Imaging section 35 includes camera 36 that captures images of substrate S and screen mask M. Control section 20 performs, for example, position alignment between screen mask M and substrate S based on the captured image.

Supply unit 40 is a unit that is movably disposed above mask section 28 and at the same height as that of printing section 24, and supplies the solder paste accommodated in cartridge 60 onto screen mask M. Supply unit 40 is disposed in front of printing head 25 (refer to FIG. 5). Supply unit 40 applies pressure to cartridge 60 to discharge the solder paste from cartridge 60. As illustrated in FIG. 2, supply unit 40 includes attachment section 41, restricting wall section 42, driving section 43, cover member 44, and fixing stay 46. Attachment section 41 attaches and detaches cartridge 60 accommodating the solder paste. Attachment section 41 is provided on a left surface side of restricting wall section 42. A snap lock having a hook and a pivoting lever is disposed on cartridge 60, and cartridge 60 is attached and fixed to attachment section 41 by the snap lock. Attachment section 41 is disposed below driving section 43, and moves together with restricting wall section 42 in a supply operation direction (the left-right direction) by driving section 43.

Restricting wall section 42 is a wall member that covers cartridge 60 and restricts access to the inside of printing device 11. It should be noted that the expression "access to the inside of printing device 11" means that an operator inserts a part of a body such as a hand or some other member into the inside of a device having an operating configuration. Restricting wall section 42 is formed on a side surface, a lower surface, and a rear surface of cartridge 60. Restricting wall section 42 is formed along an opening edge of opening portion 15 through which cartridge 60 can pass at the standby position where cartridge 60 is placed in standby, and restricts access to the inside of printing device 11. In supply unit 40, restricting wall section 42 is always present in the vicinity of cartridge 60 not only when cartridge 60 is exchanged but also when the solder paste is supplied to screen mask M.

Driving section 43 moves cartridge 60 attached to attachment section 41 in the supply operation direction together with restricting wall section 42. Driving section 43 includes a driving roller to which a motor is connected and disposed on a right end side of the unit, a driven roller disposed on a left end side of the unit, and a belt bridged between the driving roller and the driven roller in the left-right direction. Attachment section 41 and restricting wall section 42 are fixed to the belt, and attachment section 41 and restricting wall section 42 move in the supply operation direction by driving of the belt. Cover member 44 is a member that covers a front portion and an upper portion of supply unit 40, and is a member that protects driving section 43 and the like. Cover member 44 includes a cutout at a standby position of cartridge 60 so as not to interfere with the replacement movement of cartridge 60.

Fixing stay 46 is fixed to an area ahead of attachment section 41. Fixing stay 46 is an upright plate-shaped member formed from a lower portion to a front portion of cover member 44. Fixing stay 46 constitutes a portion of fixing mechanism 45, and fixes cartridge 60 at the standby position. Fixing mechanism 45 is a mechanism for restricting movements of attachment section 41 and restricting wall section 42 in the supply operation direction when cartridge 60 is at the standby position and door member 16 is in the open state and allows movements of attachment section 41 and restricting wall section 42 in the supply operation direction when door member 16 is in the closed state. As illustrated in FIGS. 3 and 4, fixing mechanism 45 includes fixing stay 46, hook member 47, biasing member 48, releasing pin 49, and releasing stay 56. Hook member 47 is a member in which a groove section into which an upper end of fixing stay 46 is inserted is formed, and pivots between a fixing position (FIG. 3) and a releasing position (FIG. 4) about a support shaft supported by a support member fixed to a window frame. Biasing member 48 is an elastic body such as a spring, and biases hook member 47 toward the fixing position. Releasing pin 49 is a member that moves hook member 47 to the releasing position when releasing pin 49 is pushed against releasing stay 56 disposed in door member 16. In fixing mechanism 45, hook member 47 is placed at the releasing position when door member 16 is in the closed state, attachment section 41 and restricting wall section 42 are movable (FIG. 4), whereas in the open state of door member 16, hook member 47 engages fixing stay 46 at the fixing position, and thus, attachment section 41 and restricting wall section 42 are fixed at the standby position. As described above, fixing mechanism 45 is a mechanism that physically restricts and cancels the movement of cartridge 60 in accordance with the position of door member 16.

Coupling section 50 connects and disconnects supply unit 40 and printing section 24 (print moving section 26). Moreover, coupling section 50 also serves as a fixing section for fixing supply unit 40 to main body 14. That is, coupling section 50 fixes supply unit 40 to main body 14 of printing device 11 in the standby area and releases the connection with print moving section 26, while connecting supply unit 40 and print moving section 26 to each other and releasing the fixing to main body 14. Coupling section 50 is disposed at a left end portion and a right end portion of supply unit 40. As illustrated in FIGS. 6 and 7, coupling section 50 includes fixing rod 51 and air cylinder 52 (driving section). Fixing rod 51 is a rod-like member inserted into air cylinder 52, and is driven by air cylinder 52. Fixing rod 51 moves between a moving section coupling position (FIG. 6) for connecting supply unit 40 and print moving section 26 and releasing the fixing to main body 14, and a main body fixing position (FIG. 7) for fixing supply unit 40 to main body 14 and releasing the connection to print moving section 26. L-shaped engagement member 23 having an insertion hole formed in a horizontal plane is fixed to printing section 24. In addition, L-shaped fixing member 53 having an insertion hole formed in a horizontal plane in a column member is fixed to main body 14. Fixing rod 51 is inserted only into engagement member 23 at the moving section coupling position, and is inserted only into fixing member 53 at main body fixing position. Pressurized air (not illustrated) is supplied to air cylinder 52, and thus, fixing rod 51 is driven up and down by switching of a supply path. In addition, fixed detection sensor 54 is disposed on fixing member 53. Fixed detection sensor 54 is a sensor that outputs a signal when a plate-like member disposed in supply unit 40 is inserted. Control section 20 can detect that supply unit 40 is present in the standby area based on the output signal of fixed detection sensor 54. In addition, a coupling sensor (not illustrated) is disposed in printing section 24, and thus, it is possible to confirm whether supply unit 40 is appropriately coupled. In addition, a position sensor (not illustrated) is disposed on coupling section 50, and thus, a position of fixing rod 51 can be detected. Control section 20 cuts off a driving force of driving section 43 when cartridge 60 is at a predetermined standby position (refer to FIG. 2) and coupling section 50 disconnects print moving section 26 and supply unit 40 from each other. In addition, since cartridge 60 is fixed by fixing mechanism 45 at the standby position, cartridge 60 is prevented from erroneously moving at the time of replacement or the like.

As illustrated in FIG. 8, cartridge 60 has cylindrical main body portion 61 and flange portion 62 formed to have a larger diameter than that of main body portion 61. Cartridge 60 includes accommodation container 63, lid member 64, nozzle 65, and connecting section 66. Accommodation container 63 is a cup-shaped container in which a solder paste is accommodated and one end portion is open. Lid member 64 is a member fitted into and inserted into an opening of accommodation container 63. Nozzle 65 for discharging the solder paste to the outside is formed at the center of lid member 64. Connecting section 66 is a hole through which air supply section 68 is inserted and connected, and is formed at the center of flange portion 62. Air supply section 68 is inserted into connecting section 66, and thus, air is supplied to the inside of main body portion 61 via pipe 67. Cartridge 60 discharges the solder paste from nozzle 65 by relatively moving accommodation container 63 and lid member 64 by the air supplied from connecting section 66 and pushing lid member 64 into the interior of accommodation container 63. In cartridge 60, accommodation container 63 constitutes a piston, and when the solder paste is discharged, a bottom surface of accommodation container 63 is pressed by air to move accommodation container 63 downward. In cartridge 60, a remaining amount detection sensor is disposed, and thus, a used amount and a remaining amount of the solder paste can be detected in accordance with a position of accommodation container 63.

Figure 10:
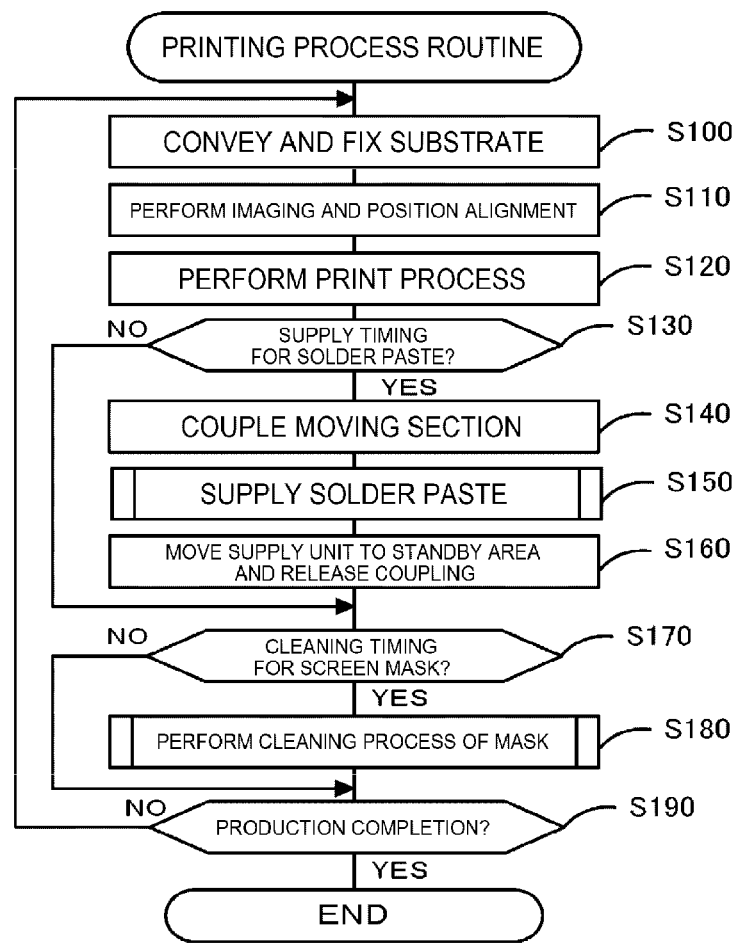
FIG. 10 is a flowchart illustrating an example of a printing process routine.
Figure 11:
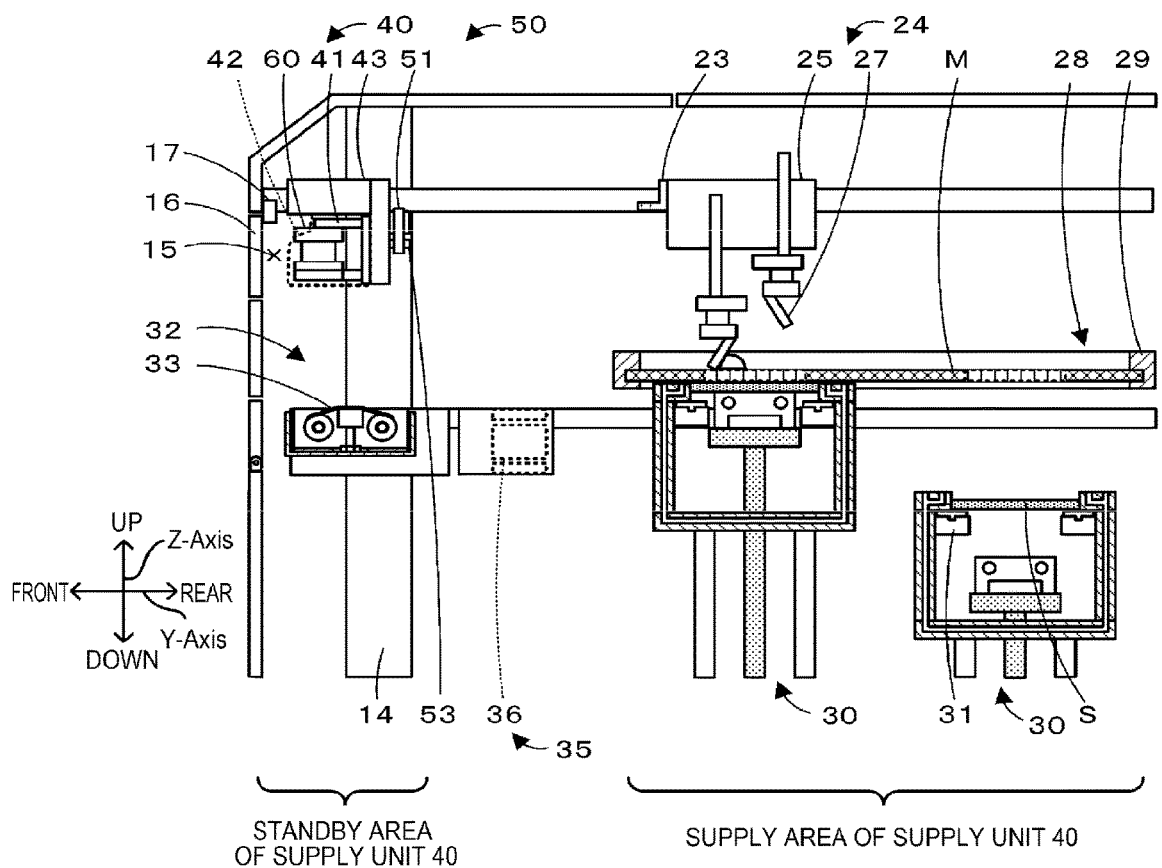
FIG. 11 is an explanatory view of print process.

Next, an operation of printing device 11 configured as described above, first, an operation of a print process will be described. FIG. 10 is a flowchart illustrating an example of a printing process routine executed by CPU 21 of control section 20. This routine is stored in a storage section of control section 20 and executed in accordance with an input of the operator to initiate the print process. When this routine is executed, CPU 21 causes substrate processing section 30 to convey and fix substrate S (S100), causes imaging section 35 to read reference marks of substrate S and screen mask M, to perform the position alignment between substrate S and screen mask M (S110), and causes printing section 24 to execute the print process (S120). In the print process, printing head 25 is moved, and the solder paste is supplied onto substrate S disposed on a lower surface of screen mask M by squeegee 27. FIG. 11 is an explanatory view of the print process by printing section 24.

Figure 12:
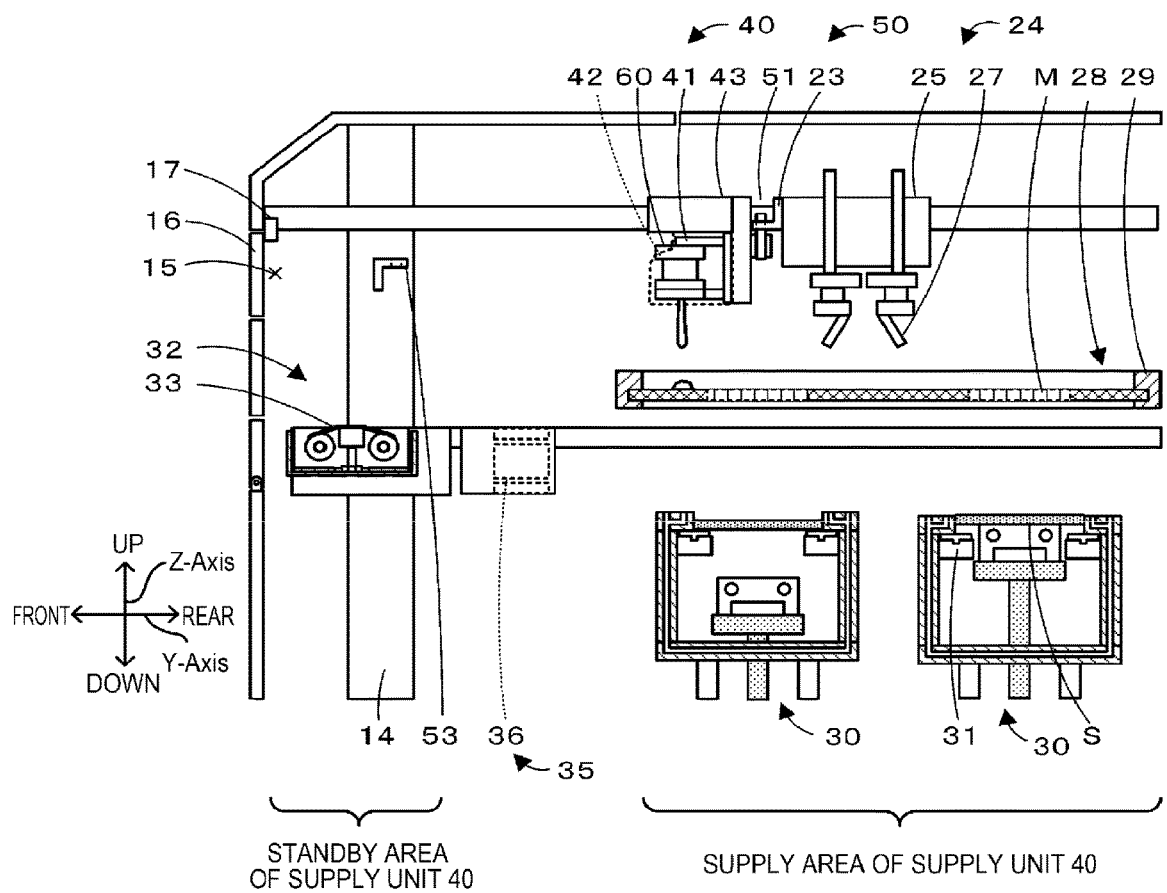
FIG. 12 is an explanatory view of supply process.

Next, CPU 21 determines whether it is a supply timing for the solder paste (S130), and when it is the supply timing for the solder paste, CPU 21 couples printing section 24 to supply unit 40 (S140), and causes supply unit 40 to supply the solder paste on screen mask M (S150). The determination of the supply timing for the solder paste may be made by detecting an amount of solder paste used or by predicting the amount of solder paste based on a printing time. In S140, CPU 21 causes printing section 24 to move to the vicinity of supply unit 40 being placed in standby in the standby area, fixing rod 51 of coupling section 50 to move to the moving section coupling position so that print moving section 26 and supply unit 40 are coupled with each other, and releases the fixing to main body 14. FIG. 12 is an explanatory view of supply process by supply unit 40. In S150, CPU 21 causes supply unit 40 to move above screen mask M, so that the solder paste is discharged from nozzle 65 while cartridge 60 moves in the supply operation direction (left-right) above a solder roll. When the supply process is finished, CPU 21 causes print moving section 26 to move supply unit 40 to the standby area, fixing rod 51 to move to the main body fixing position, releases coupling with printing section 24, and fixes supply unit 40 (S160).

After S160 or when it is not the supply timing for the solder paste in S130, CPU 21 determines whether it is a cleaning timing for screen mask M (S170). This determination can be made based on whether the print process time has elapsed a predetermined cleaning time. When it is the cleaning timing for screen mask M, cleaning section 32 performs the cleaning process of screen mask M (S180). After S180 or when it is not the cleaning timing for screen mask M in S170, CPU 21 determines whether a production process of substrate S is completed (S190), and executes processes after S100 when the production process of substrate S is not completed. Meanwhile, when the production process of substrate S is completed in S190, the routine is finished.

Figure 13:
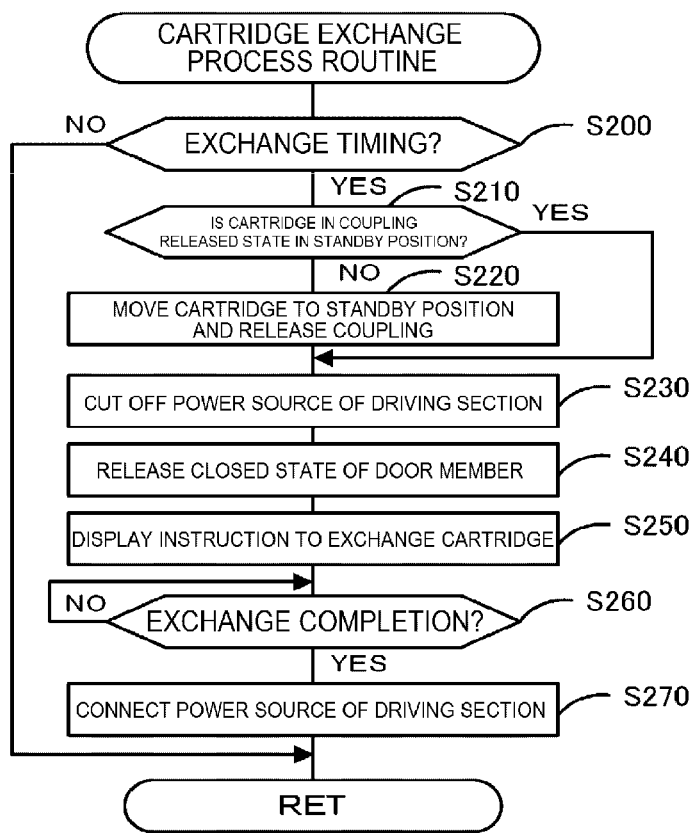
FIG. 13 is a flowchart illustrating an example of a cartridge exchange process routine.

Next, an operation performed when cartridge 60 of supply unit 40 is exchanged will be described. FIG. 13 is a flowchart illustrating an example of a cartridge exchange process routine executed by CPU 21 of control section 20. This routine is stored in the storage section of control section 20, and is repeatedly executed at predetermined intervals in parallel with the printing process routine. When this routine is executed, CPU 21 determines whether it is an exchange timing for cartridge 60 based on the position of accommodation container 63 detected by the remaining amount detection sensor (S200). When it is not the exchange timing for cartridge 60, CPU 21 terminates this routine as it is. Meanwhile, when it is the exchange timing for cartridge 60 in S200, CPU 21 determines whether supply unit 40 is in the standby area, cartridge 60 is at the standby position, and the coupling with print moving section 26 is released (S210). When either supply unit 40 is not in the standby area, cartridge 60 is not at the standby position, or supply unit 40 is coupled to print moving section 26, after waiting until the process currently performed is finished, supply unit 40 is moved to the standby area, cartridge 60 is moved to the standby position, and the coupling with print moving section 26 is released (S220). FIG. 5 is an explanatory view of the decoupling and main body fixing process of coupling section 50.

After S220 or when cartridge 60 is at the standby position and the coupling with print moving section 26 is released in S210, CPU 21 cuts off the power source of driving section 43 (S230), drives closing mechanism 17, and releases the closed state of door member 16 (S240). Subsequently, in S250, CPU 21 causes a display section of an operation panel to display an exchange instruction of cartridge 60. The operator confirms a display content of the display section, opens door member 16, detaches cartridge 60, and takes cartridge 60 to the outside. When door member 16 is opened, hook member 47 of fixing mechanism 45 engages with fixing stay 46, and thus, attachment section 41 and restricting wall section 42 are fixed (refer to FIG. 3). The operator detaches cartridge 60 after use, attaches new cartridge 60, and closes door member 16. At this time, the operator may prepare another cartridge 60 to which new accommodation container 63 is attached in advance, and replace cartridge 60 after use. When door member 16 is closed, hook member 47 of fixing mechanism 45 is pushed up, and thus, attachment section 41 and restricting wall section 42 are allowed to move (refer to FIG. 4).

After S250, CPU 21 determines whether an exchange completion input inputted by the operator is acquired from the operation panel (S260), and waits as it is when the exchange completion is not inputted. Meanwhile, when the exchange completion is inputted in S260, CPU 21 connects the power source of driving section 43 to enable cartridge 60 to move (S270), and terminates this routine. In printing device 11, even if door member 16 is opened when cartridge 60 is exchanged, the access to the inside of the device is prevented by restricting wall section 42. Therefore, in printing device 11, the printing process routine and the cartridge exchange process routine can be executed in parallel, and thus, cartridge 60 can be exchanged without stopping the print process at all.

Here, correspondence relationships between constituent elements of the present embodiment and constituent elements of the present disclosure will be clarified. Screen mask M of the present embodiment corresponds to a screen mask, substrate S corresponds to a printing target, the solder paste corresponds to a viscous fluid, cartridge 60 corresponds to a cartridge, attachment section 41 corresponds to an attachment section, restricting wall section 42 corresponds to a restricting wall section, and driving section 43 corresponds to a driving section. In addition, print moving section 26 corresponds to a moving section, opening portion 15 corresponds to an opening portion, door member 16 corresponds to a door member, closing mechanism 17 corresponds to a closing mechanism, control section 20 corresponds to a control section, fixing mechanism 45 corresponds to a fixing mechanism, and printing section 24 corresponds to a printing section. The supply unit of the present disclosure and the control method for the printing device of the present disclosure will be described according to the descriptions of printing device 11 in the present embodiment.

Supply unit 40 of the present embodiment described above includes attachment section 41 to and from which cartridge 60 accommodating the solder paste as the viscous fluid is attachable or detachable, restricting wall section 42 that covers cartridge 60 and restricts the access to the inside of printing device 11, and driving section 43 that moves cartridge 60 attached to attachment section 41 in the supply operation direction together with restricting wall section 42. In supply unit 40, attachment section 41 to which cartridge 60 is attached and restricting wall section 42 are moved together in the supply operation direction. Generally, in a case where a restricting wall section for restricting access to the inside of printing device 11 is disposed on the main body side of printing device 11, cartridge 60 may move in various directions with respect to the main body of printing device 11, and thus, since it is necessary to provide a space for accommodating the cartridge or the like in the restricting wall section, the configuration is complicated. In supply unit 40 of the present embodiment, since restricting wall section 42 moves together with cartridge 60, restricting wall section 42 always exists in the vicinity cartridge 60 even when cartridge 60 is exchanged, and a special space for accommodating cartridge 60 is not required. Accordingly, in supply unit 40, when exchanging cartridge 60 of the viscous fluid, security can be secured and interruption of the process can be further suppressed while simplifying the configuration.

Moreover, attachment section 41 is located below driving section 43, and restricting wall section 42 is formed on the side surface, the lower surface, and the rear surface of cartridge 60. In this supply unit, it is possible to restrict access to the inside of the printing device from the side surface, the lower surface, and the rear surface of the cartridge. In addition, printing device 11 has opening portion 15 through which cartridge 60 of supply unit 40 can pass at the standby position where cartridge 60 is placed in standby, and restricting wall section 42 is formed along an opening edge of opening portion 15 to restrict access to the inside of printing device 11. In supply unit 40, the security can be further enhanced by restricting wall section 42 formed along the opening edge, and consequently, the interruption of the process can be further suppressed.

Furthermore, printing device 11 includes print moving section 26 serving as a moving section for moving supply unit 40 between a standby area where supply unit 40 is placed in standby and a supply area where the supply unit 40 supplies the viscous fluid, door member 16 that opens and closes opening portion 15 through which cartridge 60 can pass at the standby position where cartridge 60 is placed in standby and is lockable in the closed state, and control section 20 for controlling driving section 43 and print moving section 26 and unlocking door member 16 when cartridge 60 is at the standby position. In printing device 11, supply unit 40 is moved between the standby area in which supply unit 40 is placed in standby and the supply area in which the supply unit supplies the viscous fluid, and thus, door member 16 is unlocked when cartridge 60 is at the standby position where cartridge 60 is placed in standby. In printing device 11, since cartridge 60 can be exchanged from opening portion 15 when cartridge 60 is at the standby position, and since restricting wall section 42 that restricts the access to the inside of printing device 11 is present so as to cover cartridge 60 even at the standby position, security can be secured and the interruption of the processing can be further suppressed. In addition, unlike a case where restricting wall section 42 is provided on the main body side of printing device 11, a space is not required, and thus, the configuration can be further simplified.

In addition, print moving section 26 can be connected to and disconnected from supply unit 40, and control section 20 cuts off the driving force of driving section 43 when cartridge 60 is at the standby position and print moving section 26 and supply unit 40 are disconnected from each other. In printing device 11, since the moving power of cartridge 60 is cut off when cartridge 60 is at the standby position, door member 16 can be opened more safely. Furthermore, printing device 11 includes fixing mechanism 45 that restricts the movements of attachment section 41 and restricting wall section 42 in the supply operation direction when cartridge 60 is at the standby position and door member 16 is in the open state and allows the movements of attachment section 41 and restricting wall section 42 in the supply operation direction when door member 16 is in the closed state. In printing device 11, since the movement of cartridge 60 is restricted by fixing mechanism 45 when cartridge 60 is at the standby position and door member 16 is opened, it is possible to further secure security. Print moving section 26 moves printing head 25 having squeegee 27 for performing the print process and supply unit 40. In printing device 11, since the moving section of supply unit 40 also serves as the moving section of printing head 25, the configuration can be further simplified.

It should be noted that the supply unit, the printing device, and the control method for the printing device of the present disclosure are not limited to any of the above embodiments, and may be implemented in various manners as long as they fall within a technical scope of the present disclosure.

For example, in the above embodiment, attachment section 41 is located below driving section 43, and restricting wall section 42 is formed on the side surface and the lower surface of cartridge 60; however, the configuration is not limited to this. For example, attachment section 41 may be located on a front surface of driving section 43, and restricting wall section 42 may also be formed on an upper surface of driving section. In addition, attachment section 41 may be disposed on a rear surface side of cartridge 60, and restricting wall section 42 may not be formed on the rear surface of cartridge 60. Restricting wall section 42 may be formed on a side which restricts access to the inside of the device.

In the above embodiment, the driving force (power source) of driving section 43 is cut off when cartridge 60 is at the standby position and print moving section 26 and supply unit 40 are disconnected; however, the configuration is not limited to this, and this process may be omitted. From the viewpoint of enhancing the security, it is preferable to cut off the driving force of driving section 43.

In the above embodiment, attachment section 41 and restricting wall section 42 are fixed by fixing mechanism 45 configured by hook member 47 and fixing stay 46; however, the configuration is not limited to this. For example, a configuration other than hook member 47 and fixing stay 46 may be used to restrict the movements of attachment section 41 and restricting wall section 42.

In the above embodiment, coupling section 50 has fixing rod 51 and air cylinder 52 that switch the coupling between supply unit 40 and print moving section 26 and the fixing of supply unit 40 to main body 14; however, the configuration is not limited to this, and a member that couples supply unit 40 and print moving section 26 and a member that fixes supply unit 40 to main body 14 may be separate members. Although the number of members increases even in printing device 11, it is possible to further suppress the interruption of the process related to the printing while securing security when exchanging cartridge 60.

In the above embodiment, door member 16 is locked by closing mechanism 17 and joint member 19; however, the configuration is not limited to this, a well-known locking mechanism can be used as long as door member 16 is locked.

In the above embodiment, door member 16 is provided in opening portion 15 provided on the extension line in the movement direction (the printing direction, the front-rear direction) of supply unit 40 so that cartridge 60 is exchanged from opening portion 15; however, the configuration is not limited to this. For example, a door member may be disposed in an opening portion provided in a direction different from the movement direction of supply unit 40 so that cartridge 60 may be exchanged from the opening portion. The direction in which cartridge 60 is removed may be arbitrary.

In the above embodiment, door member 16 is a sliding window, but the opening operation of door member 16 is not particularly limited to this, and may be arbitrary as long as door member 16 can be opened. For example, the door member may be pivoted toward the front-down direction, or may be pivoted toward the front-up direction to open opening portion 15. It should be noted that the sliding window is more preferable in view of a space saving of the device.

In the above embodiment, print moving section 26 moves printing section 24 and supply unit 40; however, the configuration is not limited to this, and supply unit 40 may be moved by a moving section different from print moving section 26. Although the number of moving sections increases even in this printing device, it is possible to further suppress the interruption of the process related to the printing while securing security when exchanging cartridge 60.

In the above embodiment, door member 16 is disposed on the main body side, and fixing rod 51 is inserted into fixing member 53 disposed on main body 14. That is, door member 16 and fixing rod 51 are fixed to the main body side, and examples of the member on the main body side include a housing, a fixing member, a cover member, and a column member disposed in the main body as long as it is not a member that frequently moves or operates such as cleaning section 32.

In the above embodiment, the present disclosure has been described as printing device 11 including supply unit 40; however, the present disclosure is not limited to this, and may be only supply unit 40 or may be the control method for printing device 11.

The supply unit, the printing device, and the control method for the printing device of the present disclosure may be configured as follows. For example, in the supply unit of the present disclosure, the attachment section may be located below the driving section, and the restricting wall section may be formed on a side surface and a lower surface of the cartridge. In this supply unit, the access to the inside of the printing device from the side surface or the lower surface of the cartridge can be restricted. It should be noted that a restricting wall section for restricting the access to the inside of the printing device may also be formed on the rear surface of the cartridge. Alternatively, the attachment section for restricting the access to the inside of the printing device may be formed on the rear surface of the cartridge.

In the supply unit of the present disclosure, the printing device may have the opening portion through which the cartridge can pass at a standby position where the supply unit is placed in standby, and the restricting wall section may be formed along the opening edge of the opening portion to restrict the access to the inside of the printing device. In this supply unit, the security can be further enhanced by the restricting wall section formed along the opening edge, and consequently, the interruption of the process can be further suppressed.

The printing device of the present disclosure includes any of the above-described supply unit, a moving section configured to move the supply unit between a standby area in which the supply unit is placed in standby and a supply area in which the supply unit supplies the viscous fluid, a door member configured to open and close an opening portion through which the cartridge can pass at a standby position where the cartridge is placed in standby in the standby area and be lockable in a closed state, and a control section configured to control the driving section and the moving section and unlock the door member when the cartridge is at the standby position.

In this printing device, the supply unit is moved between the standby area in which the supply unit is placed in standby and the supply area in which the supply unit supplies the viscous fluid, and thus, when the cartridge is at the standby position where the cartridge is placed in standby, the door member that opens and closes the opening portion through which the cartridge can pass is unlocked. In this printing device, the cartridge can be exchanged from the opening portion when the cartridge is at the standby position and the restricting wall section that restricts the access to the inside of the printing device is present so as to cover the cartridge even at this standby position, and thus, security can be secured and the interruption of the process can be further suppressed. In addition, unlike a case where the restricting wall section is provided on a main body side of the printing device, a space is not required, and thus, the configuration can be further simplified.

In the printing device of the present disclosure, the moving section may be connectable to and disconnectable from the supply unit, and the control section may cut off a driving force of the driving section when the cartridge is at the standby position and the moving section and the supply unit are disconnected from each other. In this printing device, since the power for moving the cartridge is entirely cut off when the cartridge is at the standby position, the door member can be opened more safely. In the printing device, there may be provided a fixing mechanism configured to restrict movements of the attachment section and the restricting wall section in the supply operation direction when the cartridge is at the standby position and the door member is in an open state and allows the movements of the attachment section and the restricting wall section in the supply operation direction when the door member is in the closed state. In this printing device, since the movement of the cartridge is restricted when the cartridge is at the standby position and the door member is opened, it is possible to further secure security.

In the printing device of the present disclosure, the door member may be disposed on the main body side of the printing device so as to open and close an opening portion provided on an extension line in the movement direction along which the moving section moves the supply unit. It should be noted that the "main body side" does not mean a member that frequently moves or operates such as a cleaning section, but includes a housing that is a main body, a fixing member, a cover member, a column member, and the like disposed in the main body.

In the printing device of the present disclosure, the moving section may be a printing head having a squeegee configured to move the viscous fluid on a screen mask to perform the print process. In this printing device, since the moving section of the supply unit also serves as the printing head, the configuration can be further simplified.

A control method for a printing device of the present disclosure including a supply unit having an attachment section to and from which a cartridge accommodating a viscous fluid is attachable or detachable, a restricting wall section configured to cover the cartridge and restrict access to an inside of the printing device, and a driving section configured to move the cartridge attached to the attachment section and the restricting wall section in a supply operation direction, a moving section configured to move the supply unit between a standby area in which the supply unit is placed in standby and a supply area in which the supply unit supplies the viscous fluid, and a door member configured to open and close an opening portion through which the cartridge passes at a standby position in the standby area in which the cartridge is placed in standby and be lockable in a closed state, to perform a print process of the viscous fluid on a printing target, the method including: (a) controlling the driving section and the moving section to move the cartridge to the standby position; and (b) unlocking the door member when the cartridge is at the standby position.

In the control method for the printing device, similarly to the printing device described above, the cartridge can be exchanged from the opening portion when the cartridge is at the standby position and the restricting wall section that restricts the access to the inside of the printing device is present so as to cover the cartridge at this standby position, and thus, security can be secured and the interruption of the process can be further suppressed. In addition, unlike a case where the restricting wall section is provided on a main body side of the printing device, a space is not required, and thus, the configuration can be further simplified. Moreover, in the control method for the printing device, various aspects of the supply unit and the printing device described above may be employed, or steps for realizing each function of the printing device described above may be added.

INDUSTRIAL APPLICABILITY

The present disclosure can be used in a technical field of a device for printing a viscous fluid on a printing target.

REFERENCE SIGNS LIST

10: mounting system, 11: printing device, 12: mounting device, 14: main body, 15: opening portion, 16: door member, 17: closing mechanism, 18: insertion hole, 19: joint member, 20: control section, 21: CPU, 23: engagement member, 24: printing section, 25: printing head, 26: print moving section, 27: squeegee, 28: mask section, 29: mask fixing section, 30: substrate processing section, 31: substrate conveyance section, 32: cleaning section, 33: cleaning member, 35: imaging section, 36: camera, 40: supply unit, 41: attachment section, 42: restricting wall section, 43: driving section, 44: cover member, 45: fixing mechanism, 46: fixing stay, 47: hook member, 48: biasing member, 49: releasing pin, 50: coupling section, 51: fixing rod, 52: air cylinder, 53: fixing member, 54: fixed detection sensor, 56: releasing stay, 60: cartridge, 61: main body portion, 62: flange portion, 63: accommodation container, 64: lid member, 65: nozzle, 66: connecting section, 67: pipe, 68: air supply section, 90: management PC, M: screen mask, S: substrate

The invention claimed is:

1. A supply unit used in a printing device for performing a print process of a viscous fluid on a printing target to supply the viscous fluid, the supply unit comprising:
   an attachment section to and from which a cartridge accommodating the viscous fluid is attachable or detachable;
   a restricting wall section configured to cover the cartridge and restrict access to an inside of the printing device;
   a driving section configured to move the cartridge attached to the attachment section and the restricting wall section in a supply operation direction;
   a door member configured to open and close an opening portion through which the cartridge passes at a standby position where the cartridge is placed in standby in a standby area and be lockable in a closed state; and
   a fixing mechanism configured to restrict movements of the attachment section and the restricting wall section in the supply operation direction when the cartridge is at the standby position and the door member is in an open state and allow the movements of the attachment section and the restricting wall section in the supply operation direction when the door member is in the closed state.

2. The supply unit according to claim 1,
   wherein the attachment section is located below the driving section, and
   the restricting wall section is formed on a side surface and a lower surface of the cartridge.

3. The supply unit according to claim 1,
   wherein the printing device has an opening portion through which the cartridge passes at a standby position where the supply unit is placed in standby; and
   the restricting wall section is formed along an opening edge of the opening portion to restrict the access to the inside of the printing device.

4. A printing device for performing a print process of a viscous fluid on a printing target, the printing device comprising:
   the supply unit according to claim 1;

a moving section configured to move the supply unit between the standby area in which the supply unit is placed in standby and a supply area in which the supply unit supplies the viscous fluid; and a control section configured to control the driving section and the moving section and unlock the door member when the cartridge is at the standby position.

5. The printing device according to claim 4, wherein the moving section is connectable to and disconnectable from the supply unit, and the control section cuts off a driving force of the driving section when the cartridge is at the standby position and the moving section and the supply unit are disconnected from each other.

6. The printing device according to claim 4, wherein the moving section is a printing head having a squeegee configured to move the viscous fluid on a screen mask to perform the print process.

7. A control method for a printing device including a supply unit having an attachment section to and from which a cartridge accommodating a viscous fluid is attachable or detachable, a restricting wall section configured to cover the cartridge and restrict access to an inside of the printing device, and a driving section configured to move the cartridge attached to the attachment section and the restricting wall section in a supply operation direction, a moving section configured to move the supply unit between a standby area in which the supply unit is placed in standby and a supply area in which the supply unit supplies the viscous fluid, and a door member configured to open and close an opening portion through which the cartridge passes at a standby position where the cartridge is placed in standby in the standby area and be lockable in a closed state, to perform a print process of the viscous fluid on a printing target, the method comprising:

(a) controlling the driving section and the moving section to move the cartridge to the standby position; and (b) unlocking the door member when the cartridge is at the standby position using a fixing mechanism configured to restrict movements of the attachment section and the restricting wall section in the supply operation direction when the cartridge is at the standby position and the door member is in an open state and allow the movements of the attachment section and the restricting wall section in the supply operation direction when the door member is in the closed state.

* * * * *